(12) United States Patent
Chang et al.

(10) Patent No.: US 8,642,435 B2
(45) Date of Patent: Feb. 4, 2014

(54) PERFORMING TREATMENT ON STRESSORS

(75) Inventors: Che-Cheng Chang, New Taipei (TW); Po-Chi Wu, Zhubei (TW); Chang-Yin Chen, Taipei (TW); Zhe-Hao Zhang, Hsin-Chu (TW); Yi-Chen Huang, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 13/349,969

(22) Filed: Jan. 13, 2012

(65) Prior Publication Data

US 2013/0181262 A1 Jul. 18, 2013

(51) Int. Cl.
*H01L 21/336* (2006.01)

(52) U.S. Cl.
USPC .......... 438/301; 257/E21.43; 257/E21.431; 257/E21.438; 257/E21.619; 257/E21.62; 257/E21.632; 257/E21.634; 438/197; 438/199; 438/230; 438/300; 438/630; 438/938

(58) Field of Classification Search
USPC .............. 257/E21.43, E21.431, E21.438, 257/E21.619, E21.62, E21.632, E21.634; 438/197, 199, 230, 300, 301.63, 938
See application file for complete search history.

(56) References Cited

U.S. PATENT DOCUMENTS

| 6,536,449 B1 * | 3/2003 | Ranft et al. ................ 134/1.1 |
| 2008/0153221 A1 * | 6/2008 | Sridhar et al. ............ 438/230 |

* cited by examiner

*Primary Examiner* — Asok K Sarkar
(74) *Attorney, Agent, or Firm* — Slater & Matsil, L.L.P.

(57) ABSTRACT

A method includes forming a gate stack over a semiconductor substrate, wherein the gate stack includes a gate dielectric and a gate electrode over the gate dielectric. A portion of the semiconductor substrate adjacent to the gate stack is recessed to form a recess. A semiconductor region is epitaxially grown in the recess. The semiconductor region is implanted with a p-type impurity or an n-type impurity. A dry treatment is performed on the semiconductor region.

19 Claims, 4 Drawing Sheets

PERFORMING TREATMENT ON STRESSORS

BACKGROUND

A commonly used method for applying compressive stress to the channel regions of PMOS devices includes growing silicon germanium (SiGe) stressors in the source and drain regions. Such a method typically includes the steps of forming a gate stack on a silicon substrate, forming spacers on sidewalls of the gate stack, forming recesses in the silicon substrate and adjacent to the gate spacers, and epitaxially growing SiGe stressors in the recesses. An annealing is then performed. Since SiGe has a greater lattice constant than silicon, it expands after the annealing. The expanded SiGe stressors apply a compressive stress to the channel region of the respective MOS device, which is located between a source SiGe stressor and a drain SiGe stressor.

In the formation of the SiGe stressors, some metal elements such as iron, chromium, nickel, and the like, may be undesirably introduced into the SiGe stressors. The metal elements may come from the material of the chamber in which the SiGe stressors are grown. Following the formation of the SiGe stressors, source and drain regions are formed by performing a source and drain implantation. The source and drain implantation may cause the metal elements to be driven down into the substrate. The metal elements may aggregate to form clusters, which in turn cause the device performance tailing and the lowering of manufacturing yield.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

Method for forming a Metal-Oxide-Semiconductor (MOS) transistor is provided in accordance with various exemplary embodiments. The intermediate stages of forming the MOS transistor are illustrated. The variations of the embodiments are discussed. Throughout the various views and illustrative embodiments, like reference numbers are used to designate like elements.

Figure 1:
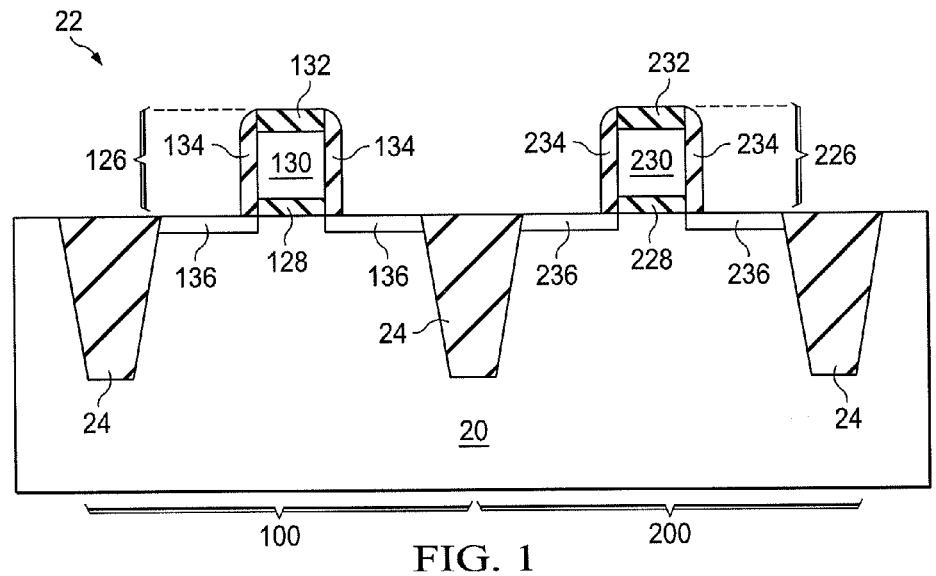
FIGS. 1 through 7 are cross-sectional views of intermediate stages in the manufacturing of a Metal-Oxide-Semiconductor (MOS) transistor in accordance with some exemplary embodiments.

FIG. 1 illustrates substrate 20 in wafer 22. Wafer 22 comprises a first portion in N-type MOS (NMOS) device region 100 and a second portion in P-type MOS (PMOS) device region 200. Shallow Trench Isolation (STI) regions 24 are formed in substrate 20 to isolate device regions 100 and 200. Substrate 20 may comprise a bulk semiconductor material such as crystalline silicon. Alternatively, substrate 20 may have a composite structure such as a Silicon-on-Insulator (SOI) structure.

Gate stack 126 is formed in NMOS device region 100 and over substrate 20. Gate stack 126 includes gate dielectric 128, gate electrode 130 over gate dielectric 128, and hard mask 132 over gate electrode 130. Gate stack 226 is formed in PMOS device region 200 and over substrate 20. Gate stack 226 includes gate dielectric 228, gate electrode 230 over gate dielectric 228, and hard mask 232 over gate electrode 130. Gate dielectrics 128 and 228 may comprise silicon oxide or high-k dielectric materials having high k values, for example, higher than about 7. Gate electrodes 130 and 230 may include commonly used conductive materials such as doped polysilicon, metals, metal silicides, metal nitrides, and combinations thereof. Lightly doped drain/source (LDD) regions 136 and 236 are formed, for example, by implanting an n-type impurity and a p-type impurity, respectively, into semiconductor substrate 20. Gate stacks 126 and 226 act as implantation masks so that the inner edges of LDD regions 136 and 236 are substantially aligned with the edges of gate stacks 126 and 226, respectively.

Gate spacers 134 and 234 are formed on the sidewalls of the respective gate stacks 126 and 226, respectively. In some embodiments, each of gate spacers 134 and 234 includes a liner oxide layer and a nitride layer over the liner oxide layer. In alternative embodiments, each of gate spacers 134 and 234 may include one or more layers, each comprising oxide, silicon nitride, silicon oxynitride, and/or other dielectric materials. Gate spacers 134 and 234 may be formed using Plasma Enhanced Chemical Vapor Deposition (PECVD), Low-Pressure Chemical Vapor Deposition (LPCVD), or the like. The formation of gate spacers 134 and 234 may include forming blanket dielectric layers over gate stacks 126 and 226, and then performing etching steps to remove the horizontal portions of the dielectric layers, so that the remaining vertical portions of the dielectric layers form gate spacers 134 and 234.

Figure 2:
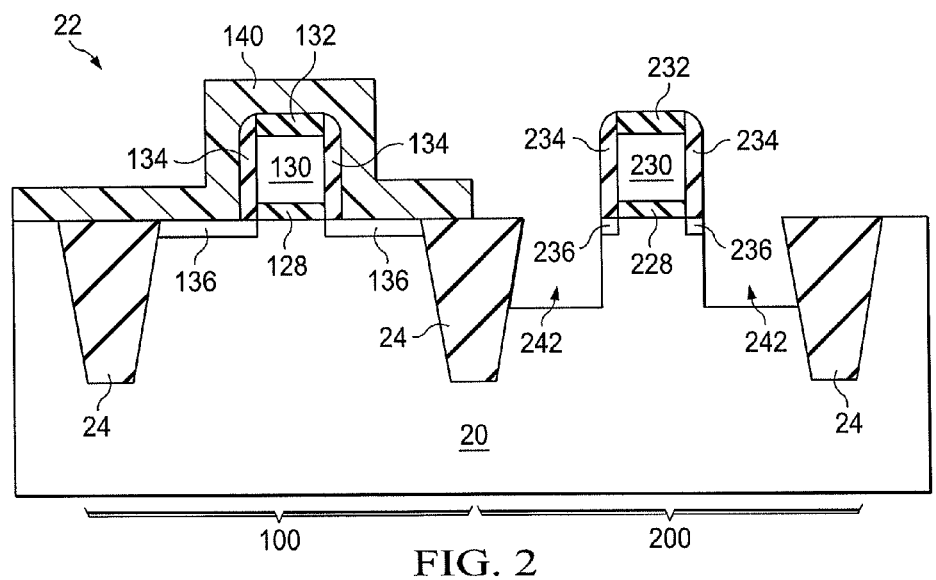
Figure 3:
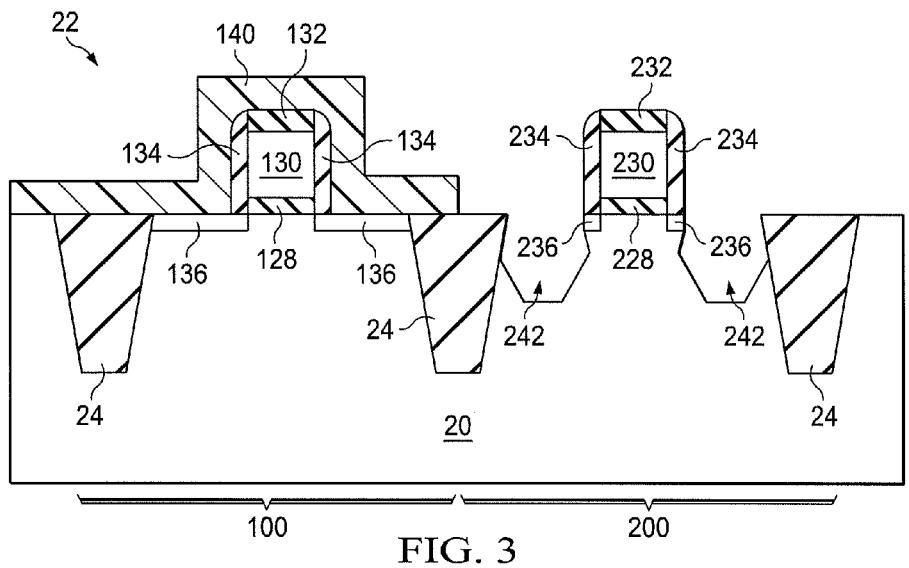

Referring to FIG. 2, mask 140, which may be a photo resist, is formed and patterned to cover NMOS device region 100. Device region 200 is not covered by mask 140. Recesses 242 are then formed by etching substrate 20, wherein gate stack 226 and gate spacers 234 are used as the etching mask. The depth of recesses 242 may be between about 500 Å and about 1,000 Å, although different depths may also be used. One skilled in the art will realize that the dimensions recited throughout the description are examples, and may be changed to different values. Referring to FIG. 3, a further etching is performed, so that the profile of recesses 242 is improved, and the surface planes of recesses 242 are pinned to stable crystal surface planes such as (001) and (111) planes.

Figure 4:
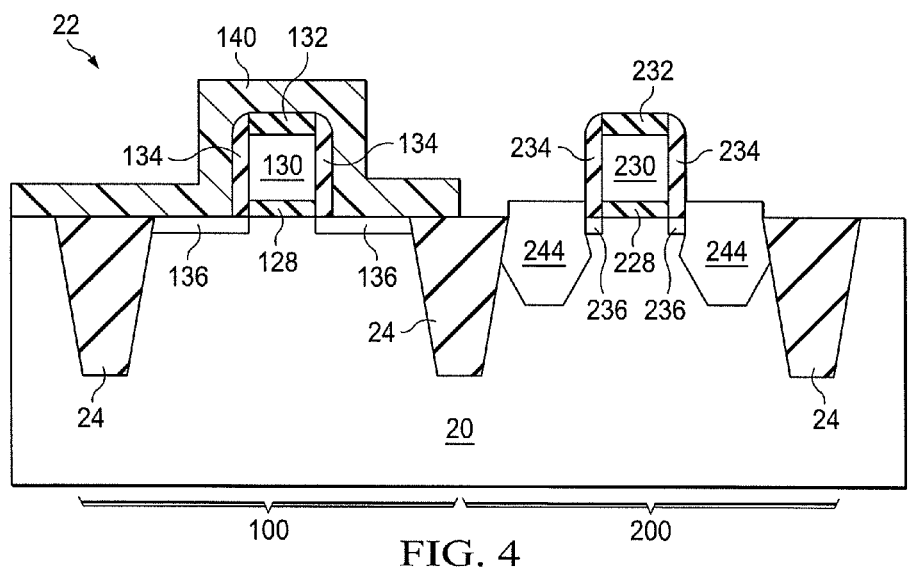

Next, as shown in FIG. 4, a semiconductor material, such as silicon germanium (SiGe), is epitaxially grown in recesses 242 by Selective Epitaxial Growth (SEG). As a result, epitaxy semiconductor regions 244 are formed in recesses 242. Semiconductor regions 244 are also referred to as SiGe stressors 244 hereinafter, although epitaxy regions 244 may be formed of other semiconductor materials such as silicon (with no germanium added therein), silicon carbon, or the like. SiGe stressors 244 may have a lattice constant greater than the lattice constant of silicon substrate 20. SiGe stressors 244, when annealed, will try to restore its lattice constant, thus introducing a compressive stress to the channel region of the resulting PMOS device.

Figure 5:
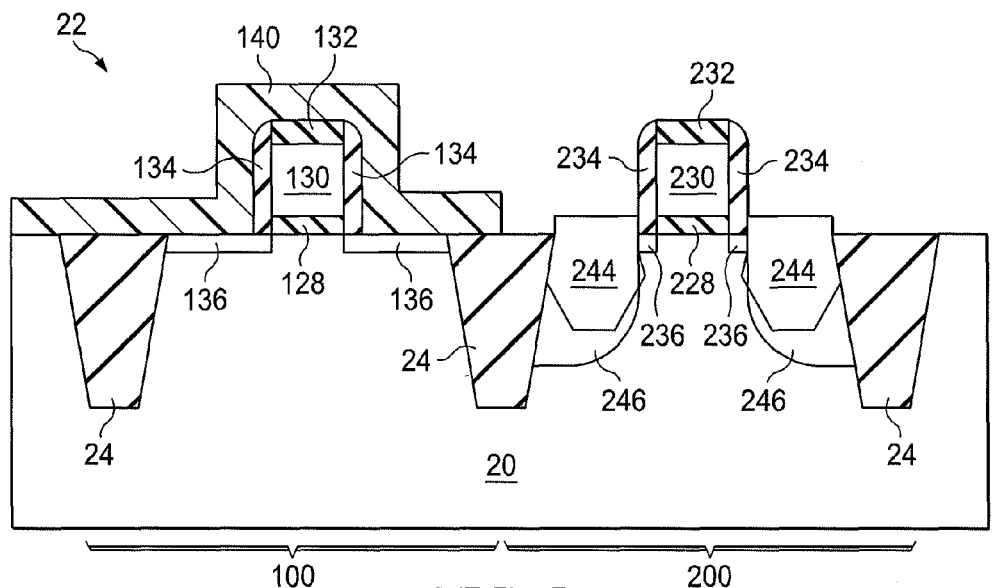

Referring to FIG. 5, a source/drain implantation is performed to implant a p-type impurity such as boron, indium, or the like, into stressors 244. Source and drain regions 246 are thus formed in SiGe stressors 244.

When SiGe stressors 244 are exposed, a dry treatment is performed. In some embodiments, the dry treatment is performed before the source/drain implantation. In alternative embodiments, the dry treatment is performed after the source/ drain implantation. In accordance with some exemplary embodiments, the process gas for performing the dry treatment includes nitrogen ($N_2$) and hydrogen ($H_2$). In alternative embodiments, the process gas may be selected from $N_2$, $H_2$, $O_2$, $NF_3$, $CF_4$, $CHF_3$, HCl, Ar, and combinations thereof. The dry treatment may be a thermal treatment and/or a plasma treatment. In some exemplary embodiments, the treatment is performed using the plasma treatment, wherein the process gas (such as $N_2+H_2$) may have a pressure between about 2 mTorr and about 10 Torr. The treatment duration may be between about 10 seconds and about 10 minutes. The dry treatment is performed long enough to allow the adequate evaporation of the undesirable metal elements. During the dry treatment, wafer 22 may be at a temperature between about 50° C. and about 300° C.

During the dry treatment, the ions of the process gases may form bonds with the metal elements that are undesirably introduced into SiGe stressors 244, for example, when the source/drain implantation is performed. The undesirable metal elements may include iron, chromium, nickel, and the like. In the source/drain implantation as shown in FIG. 5, the metal elements may be driven down. Due to the dry treatment, the resulting compound formed of the ions of the process gas and the metal elements may evaporate, and hence the undesirable metal elements are removed as the result of the dry treatment. The concentration of the undesirable metal elements in wafer 22 is thus reduced. Accordingly, the dry treatment may be performed long enough to allow the adequate evaporation of the undesirable metal elements to a level lower than the maximum concentration allowed by design specification, which maximum concentration may be about $1\times10^{10}/cm^2$.

Figure 6:
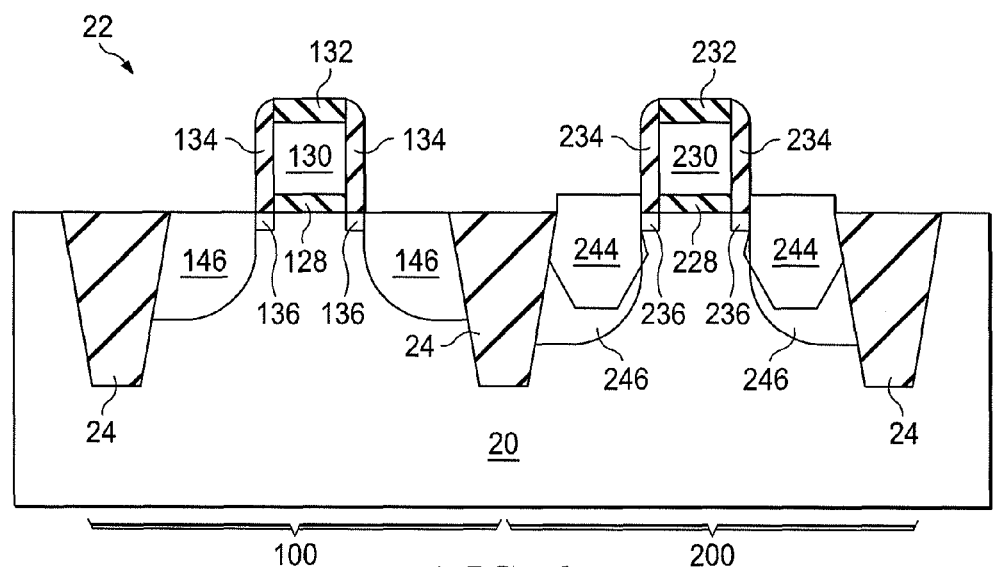

Referring to FIG. 6, an ashing process is performed to remove photo resist 140. Next, after the ashing, a wet cleaning is performed. In some exemplary embodiments, the wet cleaning is performed through the immersion of wafer 22 in a bath of $HF/NH_4OH/H_2O_2/H_2O$ for, for example, between about 10 seconds and about 10 minutes. The wet cleaning may also include a step that is performed using the solution of $HF/HCl/H_2O_2/H_2O$ for, for example, between about 10 seconds and about 10 minutes. The wet cleaning results in the further removal of the undesirable metal elements. By combining the dry treatment and the wet treatment, the concentration of the undesirable metal elements in SiGe stressors 244 can be reduced to a level significantly lower than the design specification requires.

Figure 7:
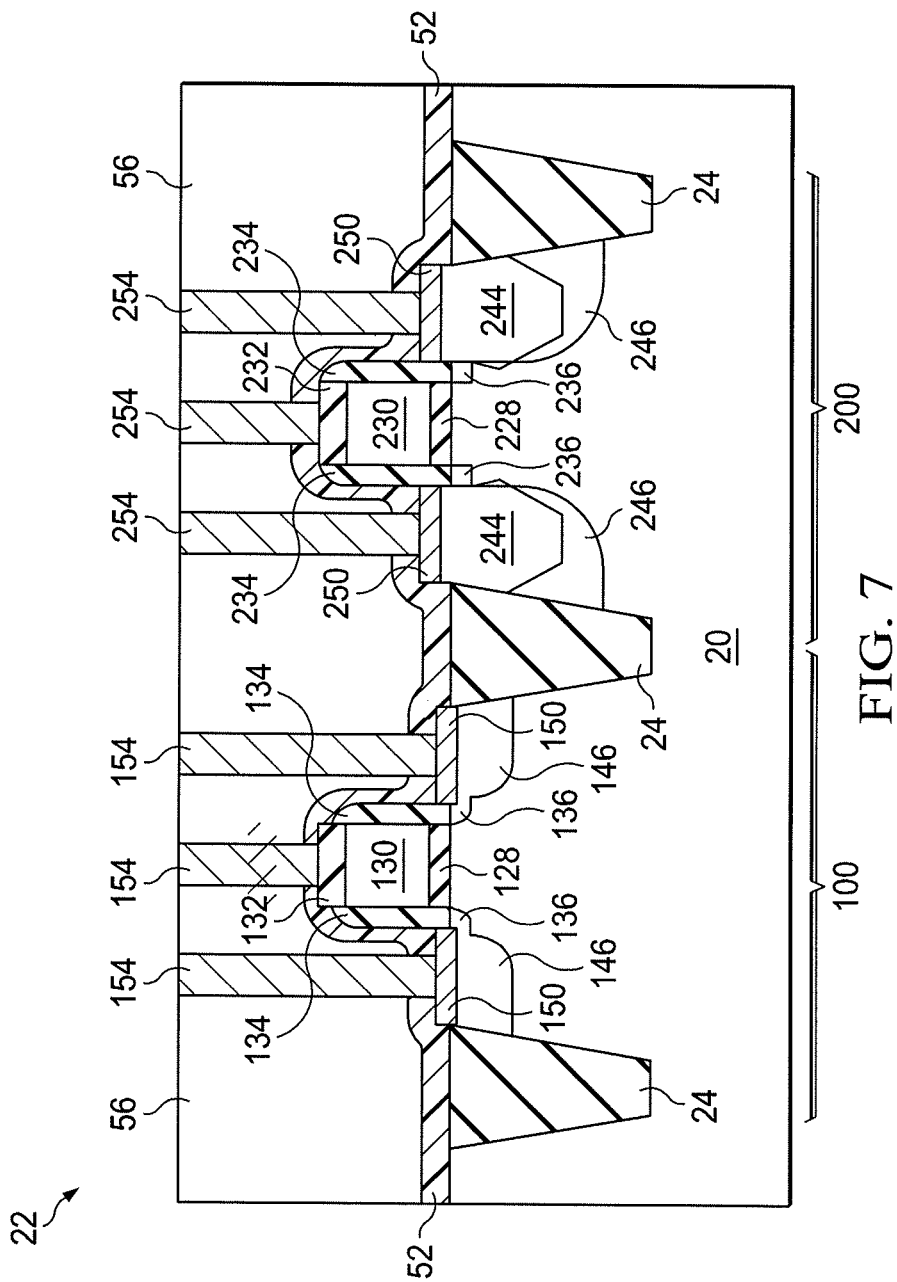

Referring to FIG. 7, source/drain regions 146 of NMOS device region 100 are formed, for example, by implanting an n-type impurity such as phosphorous, arsenic, or the like. In some embodiments, as shown in FIGS. 1 through 7, source/drain regions 146 are formed after the formation of the formation of source/drain regions 246. In alternative embodiments, source/drain regions 146 are formed before the formation of source/drain regions 246. Hard masks 132 and 232 are removed. Silicide regions 150 and 250, etch stop layer (ESL) 52, Inter-layer Dielectric (ILD) 56, and contact plugs 154 and 254 are then formed. Silicide regions 150 and 250 may be formed by depositing a thin layer of metal, such as titanium, cobalt, nickel, or the like, over the structure formed in preceding process steps. Wafer 22 is then heated, which causes the silicide reaction to occur wherever the metal is in contact with silicon. After the reaction, a layer of metal silicide is formed between silicon and metal. The un-reacted metal is selectively removed through the use of an etchant that attacks metal but does not attack silicide.

Although the above-discussed embodiments provide methods for forming PMOS devices, the teaching of the embodiments is readily available for the formation of NMOS devices. In the corresponding exemplary embodiments, the epitaxially grown regions (corresponding to silicon germanium stressors 244 in FIG. 5) of the NMOS transistors may be silicon carbon stressors or silicon regions. The dry treatment and/or the wet treatment may also be performed, for example, after the source/drain implantation, to remove the undesirably introduced metal elements. The methods and the processes of the dry treatment and/or the wet treatment may be essentially the same as discussed in the embodiments shown in FIGS. 1 through 7, except the conductivity types of LDD regions 136 and 236 and source/drain regions 246 are inverted.

Experiment results indicated that by performing the dry treatment, the concentration of the undesirable metal elements may be reduced by one order or two orders. For example, by performing the dry treatment, the resulting concentration of the metal elements may be reduced to lower than $1\times10^9/cm^2$, for example, to about $4\times10^8/cm^2$. In some embodiments, the concentration is measured using Inductive Coupled Plasma (ICP) Mass Spectrometry. Accordingly, the concentration of the metal unit is expressed using "/$cm^2$" rather than "/$cm^3$." This concentration value is lower than the maximum allowable concentration of the undesirable metal elements, which is about $1\times10^{10}/cm^2$. Without performing the dry treatment, the concentration of the metal elements was higher than $1\times10^{10}/cm^2$. Accordingly, by performing the dry treatment, the residue metal element no longer causes yield loss and device performance tailing. Furthermore, by combining the dry treatment and the wet treatment, the metal elements may be further reduced.

In accordance with embodiments, a method includes forming a gate stack over a semiconductor substrate, wherein the gate stack includes a gate dielectric and a gate electrode over the gate dielectric. A portion of the semiconductor substrate adjacent to the gate stack is recessed to form a recess. A semiconductor region is epitaxially grown in the recess. The semiconductor region is implanted with a p-type impurity or an n-type impurity. A dry treatment is performed on the semiconductor region.

In accordance with other embodiments, a method includes recessing a portion of a semiconductor substrate to form a recess extending from a top surface of the semiconductor substrate into the semiconductor substrate. A semiconductor region is grown in the recess. At a time the semiconductor region is exposed, a dry treatment is performed on the semiconductor region.

In accordance with other embodiments, a device includes a gate stack over a semiconductor substrate, wherein the gate stack includes a gate dielectric and a gate electrode over the gate dielectric. A silicon germanium stressor is disposed adjacent to the gate stack, wherein the silicon germanium stressor extends into the semiconductor substrate. The silicon germanium stressor includes a metal element, wherein a concentration of the metal element in the silicon germanium stressor is lower than $10^{10}/cm^2$, and wherein the metal element is selected from the group consisting essentially of iron, chromium, nickel, and combinations thereof.

In accordance with yet other embodiments, a method includes forming a gate stack over a semiconductor substrate, wherein the gate stack comprises a gate dielectric and a gate electrode over the gate dielectric, and recessing a portion of the semiconductor substrate adjacent to the gate stack to form a recess. A silicon germanium stressor is epitaxially grown in the recess. The silicon germanium stressor is implanted with a p-type impurity to form a source/drain region in the silicon germanium stressor. A dry treatment is performed on the silicon germanium stressor when the silicon germanium stressor is exposed. After the dry treatment, a source/drain silicide region is formed over the source/drain region.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    forming a gate stack over a semiconductor substrate, wherein the gate stack comprises a gate dielectric and a gate electrode over the gate dielectric;
    recessing a portion of the semiconductor substrate adjacent to the gate stack to form a recess;
    epitaxially growing a semiconductor region in the recess;
    implanting the semiconductor region with a p-type impurity or an n-type impurity; and
    performing a dry treatment on the semiconductor region.

2. The method of claim 1, wherein the dry treatment is performed after the step of implanting the semiconductor region.

3. The method of claim 1, wherein the dry treatment is performed before the step of implanting the semiconductor region.

4. The method of claim 1, wherein the step of implanting results in a source/drain region to be formed in the semiconductor region, and wherein the method further comprises, after the dry treatment and the step of implanting, forming a source/drain silicide region over the source/drain region.

5. The method of claim 1, wherein the dry treatment comprises a plasma treatment using a plasma generated from a process gas.

6. The method of claim 5, wherein the process gas is selected from the group consisting essentially of $N_2$, $H_2$, $O_2$, $NF_3$, $CF_4$, $CHF_3$, HCl, Ar, and combinations thereof.

7. The method of claim 6, wherein the process gas comprises $N_2$ and $H_2$.

8. The method of claim 1, further comprising, after the step of implanting the semiconductor region, performing a wet treatment on the semiconductor region.

9. The method of claim 1, wherein in the dry treatment, a metal selected from ion, chromium, nickel, and combinations thereof is removed, and wherein the dry treatment is finished after a dosage of the metal is lower than about $1 \times 10^{10}/cm^2$.

10. The method of claim 1, wherein the dry treatment is performed using a process gas comprising HCl.

11. The method of claim 1, wherein the dry treatment is performed using a process gas comprising $O_2$.

12. A method comprising:
    forming a gate stack over a semiconductor substrate, wherein the gate stack comprises a gate dielectric and a gate electrode over the gate dielectric;
    recessing a portion of the semiconductor substrate adjacent to the gate stack to form a recess;
    epitaxially growing a silicon germanium stressor in the recess;
    implanting the silicon germanium stressor with a p-type impurity to form a source/drain region in the silicon germanium stressor;
    performing a dry treatment on the silicon germanium stressor when the silicon germanium stressor is exposed; and
    after the dry treatment, forming a source/drain silicide region over the source/drain region.

13. The method of claim 12, wherein the dry treatment comprises a plasma treatment, and wherein the plasma treatment is performed using a process gas selected from the group consisting essentially of $N_2$, $H_2$, $O_2$, $NF_3$, $CF_4$, $CHF_3$, HCl, Ar, and combinations thereof.

14. The method of claim 13, wherein the process gas comprises $N_2$.

15. The method of claim 14, wherein the process gas comprises $N_2$ and $H_2$.

16. The method of claim 12 further comprising:
    before the step of recessing, forming a photo resist to cover a gate stack of an NMOS device region; and
    after the dry treatment, performing an ashing step to remove the photo resist.

17. The method of claim 16 further comprising, after the ashing step and before the step of forming the source/drain silicide region, performing a wet treatment on the silicon germanium stressor, wherein the wet treatment is performed using a chemical configured to remove metal elements from the silicon germanium stressor.

18. The method of claim 12, wherein in the dry treatment, a metal selected from ion, chromium, nickel, and combinations thereof is removed, and wherein the dry treatment finished after a dosage of the metal is lower than about $1 \times 10^{10}/cm^2$.

19. The method of claim 12, wherein the dry treatment is performed using a process gas comprising HCl.

* * * * *